(12) United States Patent
Chen

(10) Patent No.: US 6,294,428 B1
(45) Date of Patent: Sep. 25, 2001

(54) METHOD OF FORMING A FLASH MEMORY DEVICE

(75) Inventor: Hwi-Huang Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/241,759

(22) Filed: Feb. 1, 1999

(30) Foreign Application Priority Data

Dec. 19, 1998 (TW) .................................................. 87121255

(51) Int. Cl.⁷ .................................................. H01L 21/336
(52) U.S. Cl. ............................................. 438/258; 438/286
(58) Field of Search .................................... 438/258, 286, 438/FOR 203, FOR 212, FOR 220

(56) References Cited

U.S. PATENT DOCUMENTS 4,775,642 * 10/1988 Chang et al. .

5,940,709 * 8/1999 Chan .

* cited by examiner

Primary Examiner—George Fourson
Assistant Examiner—Michelle Estrada
(74) Attorney, Agent, or Firm—Jiawei Huang; J.C. Patents

(57) ABSTRACT

A method of forming a flash memory device is described. A substrate at least comprises a memory region and a peripheral circuit region. A stacked gate is formed on the memory region. The stacked gate comprises a tunneling oxide layer, a floating gate and a control gate. A capacitor is formed on the peripheral circuit region. A dielectric layer is formed over the substrate to cover the peripheral circuit region. A thin spacer is formed on the sidewall of the stacked gate. A doped region is formed in the memory region by ion implantation. A thermal process is performed to drive the dopant in the doped region into the substrate and to oxidize a part of the floating gate above the edge of the tunneling oxide layer.

5 Claims, 4 Drawing Sheets

METHOD OF FORMING A FLASH MEMORY DEVICE

CROSS-REFERENCE TO RELATED APPLICATION

This application claims the priority benefit of Taiwan application serial no. 87121255, filed Dec. 19, 1998, the full disclosure of which is incorporated herein by reference.

BACKGROUND OF THE INVENTION

1. Field of the Invention

The invention relates to a method of forming a memory device, and more particularly, to a method of forming a flash memory device.

2. Description of the Related Art

Flash memory, which is a kind of electrically erasable and programmable read only memory (EEPROM), is currently one the most widely used memory devices applied in personal computers and electronic equipment. A memory cell in a flash memory comprises a transistor with a floating gate to achieve the operations of writing, erasing, and storing data while electrically shut down.

FIG. 1A is a schematic, cross-sectional view showing a conventional flash memory device. As shown in the figure, a memory region 102 and a peripheral circuit region 104 within a substrate 100 are isolated from each other by an isolating structure 101. A stacked gate 106 of a flash memory is formed on the memory region 102. A capacitor 108 of a transistor is formed on the peripheral circuit region 104. The stacked gate 106 comprises a tunneling oxide layer 110, a floating gate 112, a dielectric layer 114 and a control gate 116. The capacitor 108 comprises a gate oxide layer 118 and a conductive gate layer 120. A source/drain region 138 is formed in the memory region 102 to complete the flash memory. Another source/drain region 140 is formed in the peripheral circuit region 104 to complete the transistor.

To enhance the reliability of the flash memory, an oxidation step is usually used to partially oxidize the edge of the floating gate 112 above the tunneling oxide layer 110 to form an oxide layer 134 as shown in FIG. 1B. Forming the oxide layer 134 increases the total thickness of the tunneling oxide layer 110. However, the capacitor 108 in the peripheral circuit region 104 is exposed in an oxygen environment while performing the oxidation step. The conductive gate layer 120 is oxidized to form an oxide layer 135 above the edge of the gate oxide layer 118. The oxidation increases the total thickness of the gate oxide layer 118 to decrease a saturated current of the transistor and further to decrease an operation velocity of the flash memory device.

SUMMARY OF THE INVENTION

It is therefore an object of the invention to provide a method of forming a flash memory device to increase the thickness of the tunneling gate layer of a flash memory cell.

It is another object of the invention to provide a method of forming a flash memory device to keep a saturated current of a peripheral circuit region of the flash memory device and to increase the operation velocity of the flash memory device.

The invention achieves the above-identified objects by providing a method of forming a flash memory device. A substrate at least comprises a memory region and a peripheral circuit region. A stacked gate is formed on the memory region. The stacked gate comprises a tunneling oxide layer, a floating gate and a control gate. A capacitor is formed on the peripheral circuit region. A dielectric layer is formed over the substrate to cover the peripheral circuit region. A thin spacer is formed on the sidewall of the stacked gate. A doped region is formed in the memory region by ion implantation. A thermal process is performed to drive the dopant in the doped region into the substrate and to oxidize a part of the floating gate above the edge of the tunneling oxide layer.

Forming the dielectric layer and the spacer comprises overall formation of a dielectric material on the substrate, providing a mask on the dielectric material positioned on the peripheral circuit region and etching back to form the thin spacer on the stacked gate. The thermal process is performed after forming the stacked gate. The thermal process is a driving-in process performed after any ion implantation step, such as forming source/drain regions or forming doped regions beside the source/drain regions.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 2A to 2F are schematic, cross-sectional views showing the steps of one preferred embodiment of the method of forming a flash memory device.

Figure 1A:
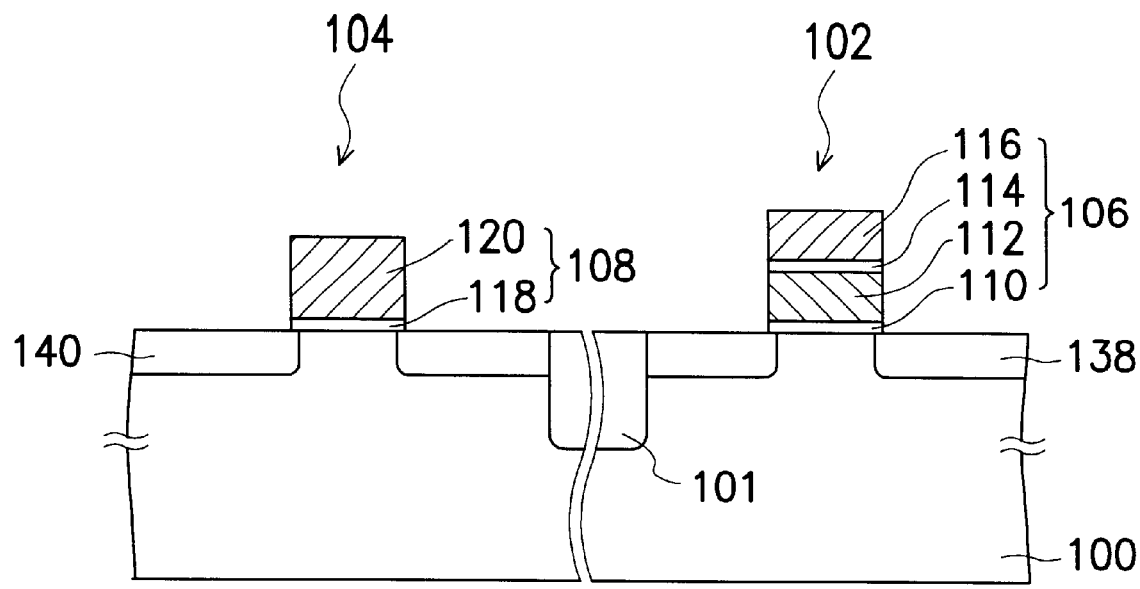
FIG. 1A is a schematic, cross-sectional view showing a conventional flash memory device.
Figure 1B:
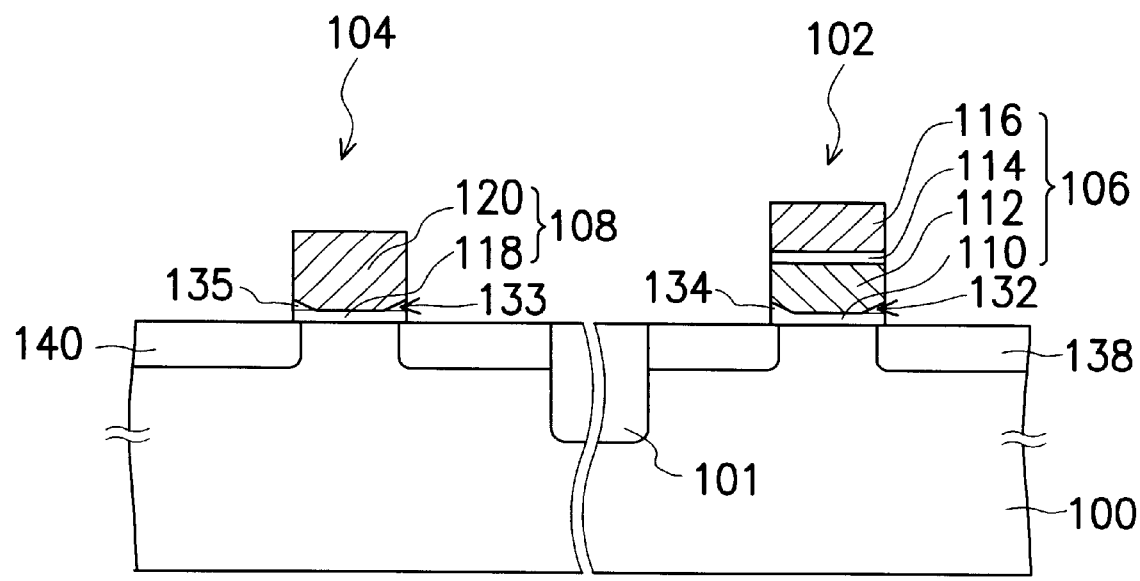
FIG. 1B is a schematic, cross-sectional view showing the structure shown in FIG. 1A after oxidation.
Figure 2A:
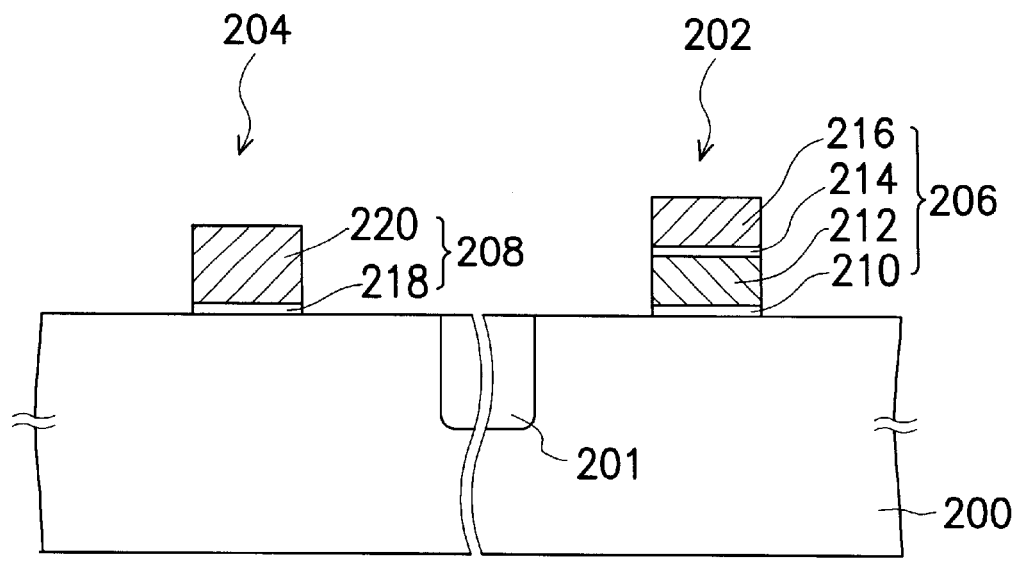
FIGS. 2A to 2F are schematic, cross-sectional views showing the steps of one preferred embodiment of the method of forming a flash memory device.

In FIG. 2A, a substrate 200 is provided. An isolation structure 201 is formed in the substrate 200 to isolate a memory region 202 and a peripheral circuit region 204 in the substrate 200. A stacked gate 206 of a flash memory is formed on the memory region 202. A capacitor 208 is formed on the peripheral circuit region 204. The capacitor structure 208 also can be used as a gate of a transistor. The stacked gate 206 comprises a tunneling oxide layer 210, a floating gate 212, a dielectric layer 214 and a control gate 216. The capacitor 208 comprises a gate oxide layer 218 and a conductive gate layer 220. The tunneling oxide layer 210 and the gate oxide layer 218 are formed, for example, by thermal oxidation. A material of the floating gate 212 and of the control gate 216 is polysilicon formed, for example, by chemical vapor deposition (CVD). Another material comprising polysilicon and metal also can be used as the floating gate 212 and the control gate 216. Dopant is added into polysilicon to form conductivity. The dopant is added in situ while forming polysilicon or implanted after deposition. A material of the dielectric layer 214 comprises silicon oxide/silicon nitride/silicon oxide.

Figure 2B:
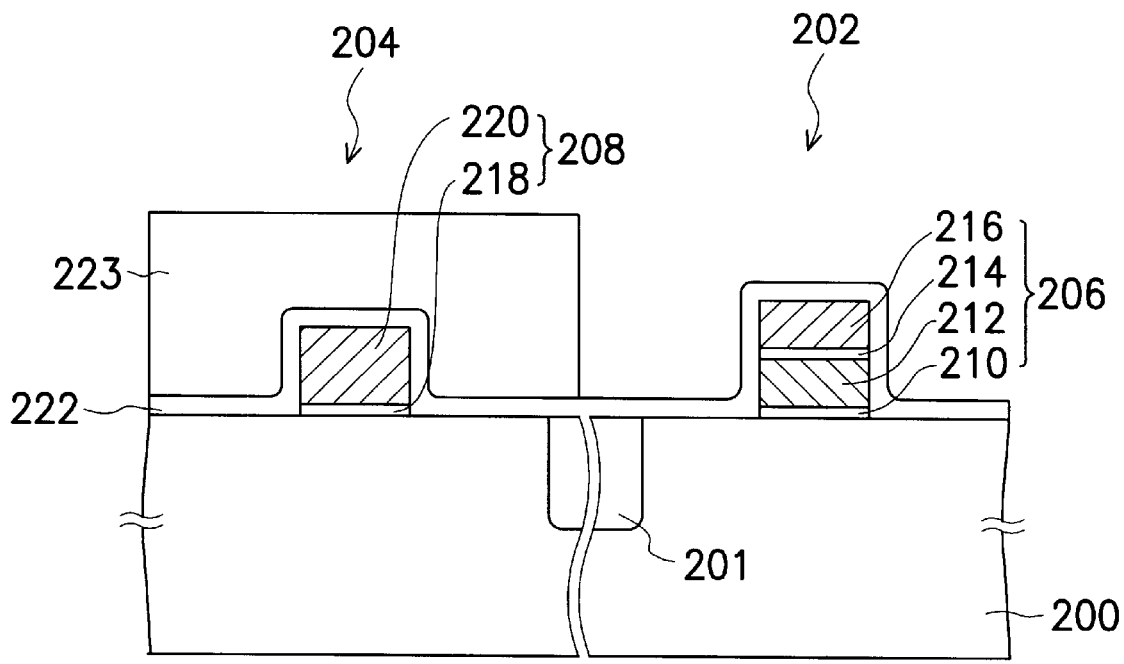

In FIG. 2B, a dielectric layer 222 is formed over the memory region 202 and the peripheral circuit region 204. A material of the dielectric layer 222 comprises silicon oxide formed by CVD. A preferred thickness of the dielectric layer 222 is about 50–200 Å. The dielectric layer 222 has to avoid oxygen penetrating through it and oxidizing the gate 220. A mask 223 is provided over the substrate 200 to cover the peripheral circuit region 204 and to expose the memory region 202. The mask, such as a photoresist, is formed on the substrate 200 by spin-coating. An exposure and development process is performed to define a pattern on the photoresist.

Figure 2C:
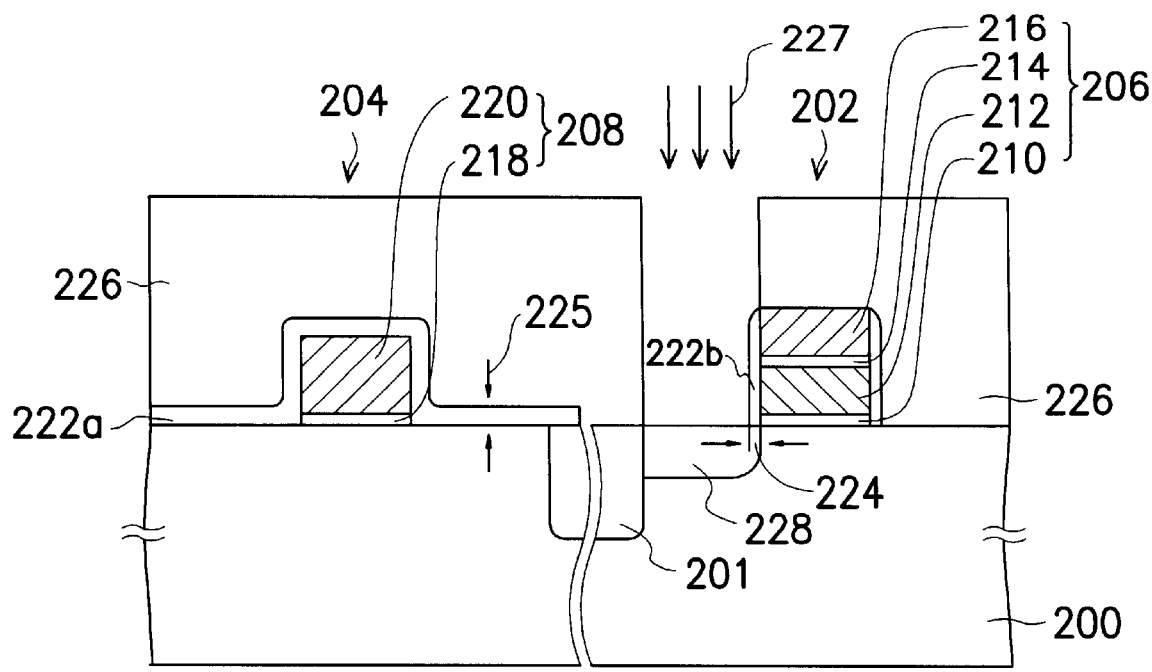

In FIG. 2C, anisotropic etching, such as plasma etching, is performed to removed a part of the dielectric layer 222 exposed by the mask 223 to leave a thin spacer 222b on the side-wall of the stacked gate 206 and to leave the dielectric layer 222a on the peripheral circuit region 204. A thickness 224 of the thin spacer 222b is smaller than a thickness 225 of the dielectric layer 222a as a result of anisotropic etching. After removing the mask 223, another mask 226, such as photoresist, is provided to cover the peripheral circuit region 204 and a part of the memory region 202. A ion implantation process 227 is performed to form a doped region 228 in the memory region 202.

Figure 2D:
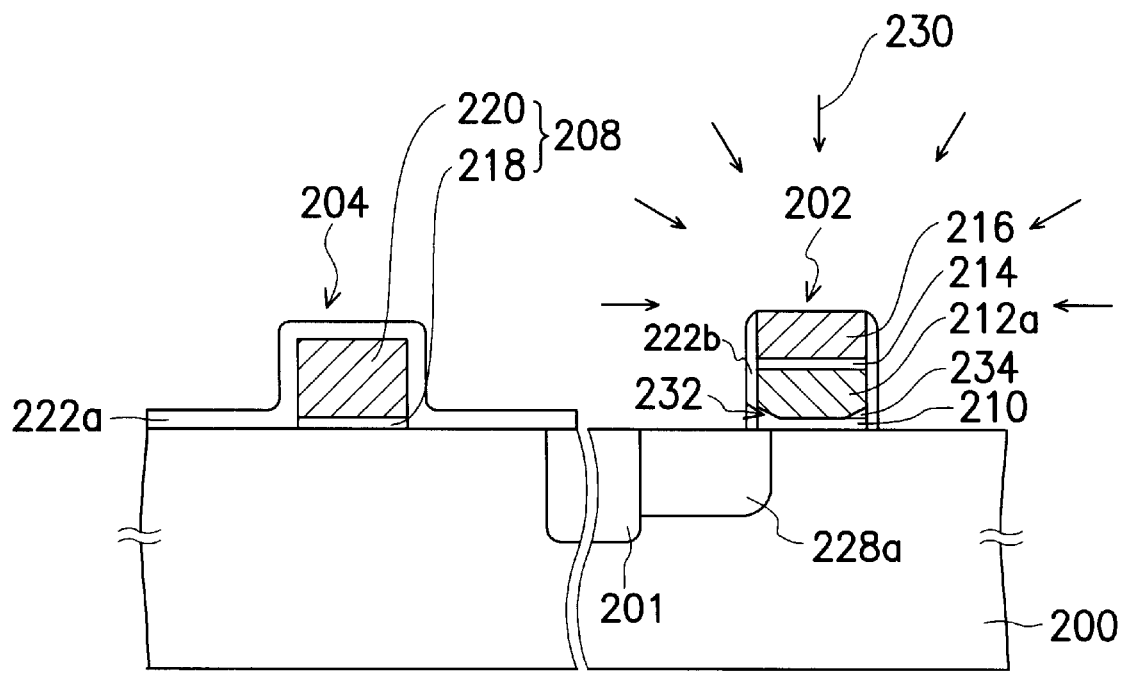

In FIG. 2D, the mask 226 is removed. A thermal process 230 is performed to activate the dopant in the doped region 228 and to drive the dopant into the substrate 200 to form another doped region 228a. Since the thermal process 230 is performed in an environment containing oxygen, oxygen penetrates through the thin spacer 222b to oxidize a part of the floating gate 212 above the edge of the tunneling oxide layer 210 to form an oxide layer 234. The oxide layer 234 increases the total thickness of the tunneling oxide layer 210 to enhance reliability of the flash memory cell. The dielectric layer 222a on the peripheral circuit region 204 is thick enough to avoid oxygen penetrating through the dielectric layer 222a so that the conductive gate layer 220 is not oxidized while performing the thermal process 230. The thickness of the gate oxide layer 218 is constant. A saturated current of the transistor formed on the peripheral circuit region 204 is thus stable.

Figure 2E:
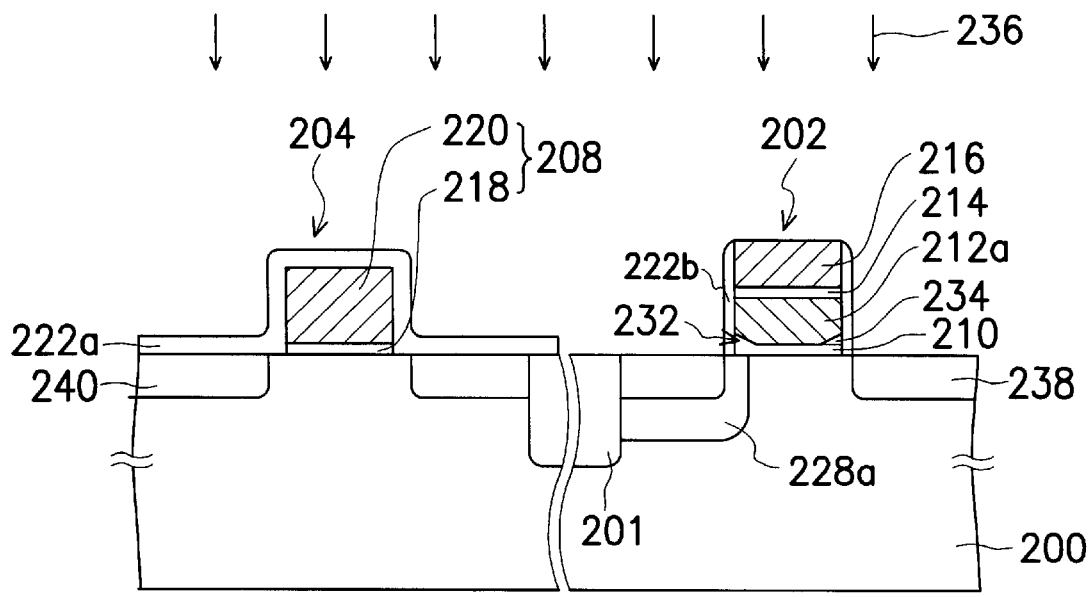

In FIG. 2E, an ion implantation process 236 is performed to form a doped region 238 in the memory region 202 and to form a doped region 240 in the peripheral circuit region 204.

Figure 2F:
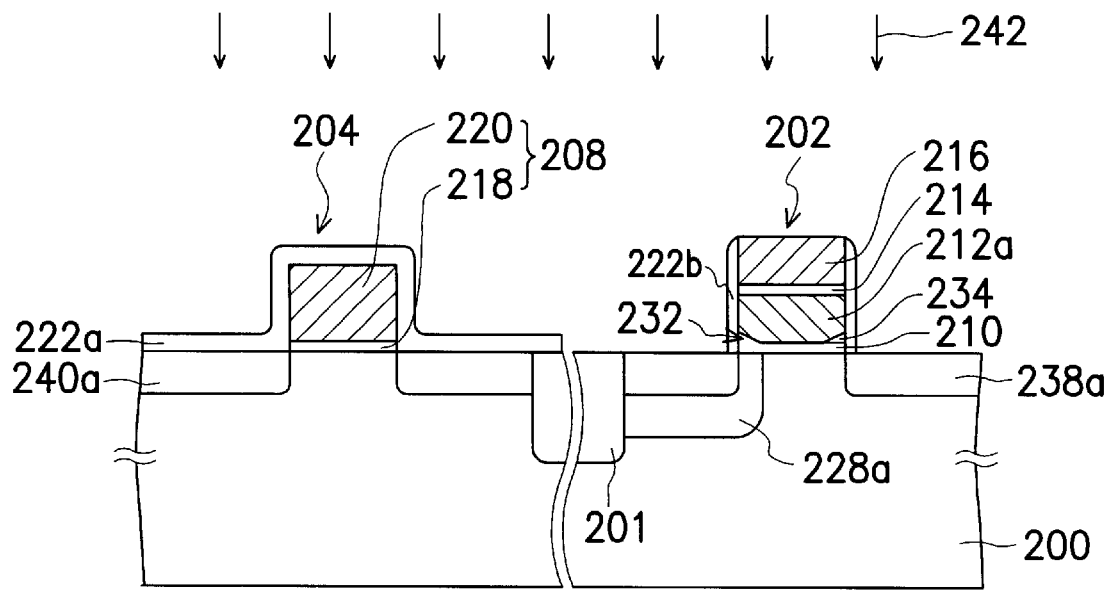

In FIG. 2F, a thermal process 242 is performed to drive dopant into the substrate 200 to form source/drain regions 238a and 240a. Since the thermal process 242 is performed in an environment containing oxygen, the oxidation of the floating gate 212 also can be performed after the thermal process 242.

Actually, the thermal process to form the oxide layer 234 is applied to form any type of flash memory devices and can be a driving-in process, an annealing process or a additional thermal process.

A feature of the invention is that the flash memory device formed from the method of the invention has better reliability than a conventional flash memory device.

Another feature of the invention is that a saturated current of the transistor on the peripheral circuit region of the flash memory device is constant.

Yet another feature of the invention is that the method can be used with any existing process of forming a flash memory device so that the method is used easily in production lines.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a flash memory device, comprising the steps of:

providing a substrate at least comprising a memory region and a peripheral circuit region, wherein a stacked gate at least comprising a tunneling oxide layer and a floating gate is formed on the memory region, and a capacitor is formed on the peripheral circuit region;

forming a dielectric layer on the substrate;

providing a first mask to cover a part of the dielectric layer on the peripheral circuit region;

performing anisotropic etching to form a thin spacer on the sidewall of the stacked gate;

removing the first mask;

providing a second mask to cover the peripheral circuit region and a part of the memory region;

performing a first ion implantation to dope a first dopant into the memory region exposed by the second mask;

removing the second mask;

performing a first driving-in process to form a doped region in the memory region and to oxidize a part of the floating gate positioned above the edge of the tunneling oxide layer;

performing a second ion implantation to dope a second dopant into a part of the memory region and a part of the peripheral circuit region; and performing a second driving-in process to form a first source/drain region in the memory region and to form a second source/drain region in the peripheral circuit region.

2. The method according to claim 1, wherein the dielectric layer is formed by chemical vapor deposition.

3. The method according to claim 1, wherein a mask material comprises photoresist.

4. The method according to claim 1, wherein the second driving-in process uses oxygen.

5. The method according to claim 1, wherein the anisotropic etching comprises plasma etching.

* * * * *